United States Patent (10) Patent No.: US 10,122,344 B2
Nakahashi et al. (45) Date of Patent: Nov. 6, 2018

(54) SURFACE ACOUSTIC WAVE FILTER

(71) Applicant: Murata Manufacturing Co., Ltd., Nagaokakyo-shi, Kyoto-fu (JP)

(72) Inventors: Norihiko Nakahashi, Nagaokakyo (JP); Koji Miyamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 265 days.

(21) Appl. No.: 15/079,259

(22) Filed: Mar. 24, 2016

(65) Prior Publication Data
US 2016/0285431 A1 Sep. 29, 2016

(30) Foreign Application Priority Data

Mar. 26, 2015 (JP) ................................. 2015-065133

(51) Int. Cl.
H03H 9/64 (2006.01)
H03H 9/02 (2006.01)
H03H 9/00 (2006.01)
H03H 9/145 (2006.01)

(52) U.S. Cl.
CPC ........ *H03H 9/6483* (2013.01); *H03H 9/0009* (2013.01); *H03H 9/02818* (2013.01); *H03H 9/02866* (2013.01); *H03H 9/14541* (2013.01)

(58) Field of Classification Search
CPC ............. H03H 9/0009; H03H 9/14541; H03H 9/6483; H03H 9/725; H03H 9/02818; H03H 9/02866
USPC .......................................... 333/133, 193–196
See application file for complete search history.

(56) References Cited

U.S. PATENT DOCUMENTS

2006/0131992 A1 6/2006 Nakao et al.
2013/0093538 A1 4/2013 Hirota et al.
2013/0127565 A1 5/2013 Nishihara et al.
2013/0300519 A1 11/2013 Tamasaki et al.

FOREIGN PATENT DOCUMENTS

| JP | 2000-315934 A | 11/2000 |
| JP | 2013-081068 A | 5/2013 |
| JP | 2013-102418 A | 5/2013 |
| JP | 2013-110655 A | 6/2013 |
| WO | 2005/011117 A1 | 2/2005 |
| WO | 2012/098816 A1 | 7/2012 |

OTHER PUBLICATIONS

Machine English Translation of JP2000-315934 Published on Nov. 14, 2000.*
Official Communication issued in Japanese Patent Application No. 2015-065133, dated Aug. 29, 2017.

* cited by examiner

*Primary Examiner* — Robert J Pascal
*Assistant Examiner* — Jorge Salazar, Jr.
(74) *Attorney, Agent, or Firm* — Keating & Bennett, LLP

(57) ABSTRACT

A ladder-type surface acoustic wave filter includes interdigital transducer electrodes disposed on a $LiTaO_3$ piezoelectric substrate, and series resonators and parallel resonators defined by the interdigital transducer electrodes, and utilizes a leaky wave that propagates on the $LiTaO_3$ piezoelectric substrate. A bandwidth ratio indicating a bandwidth of a passband of the ladder-type surface acoustic wave filter is about 2.5% or greater, and a cutoff frequency due to bulk wave radiation of one of the parallel resonators, is in a frequency range higher than the passband.

3 Claims, 12 Drawing Sheets

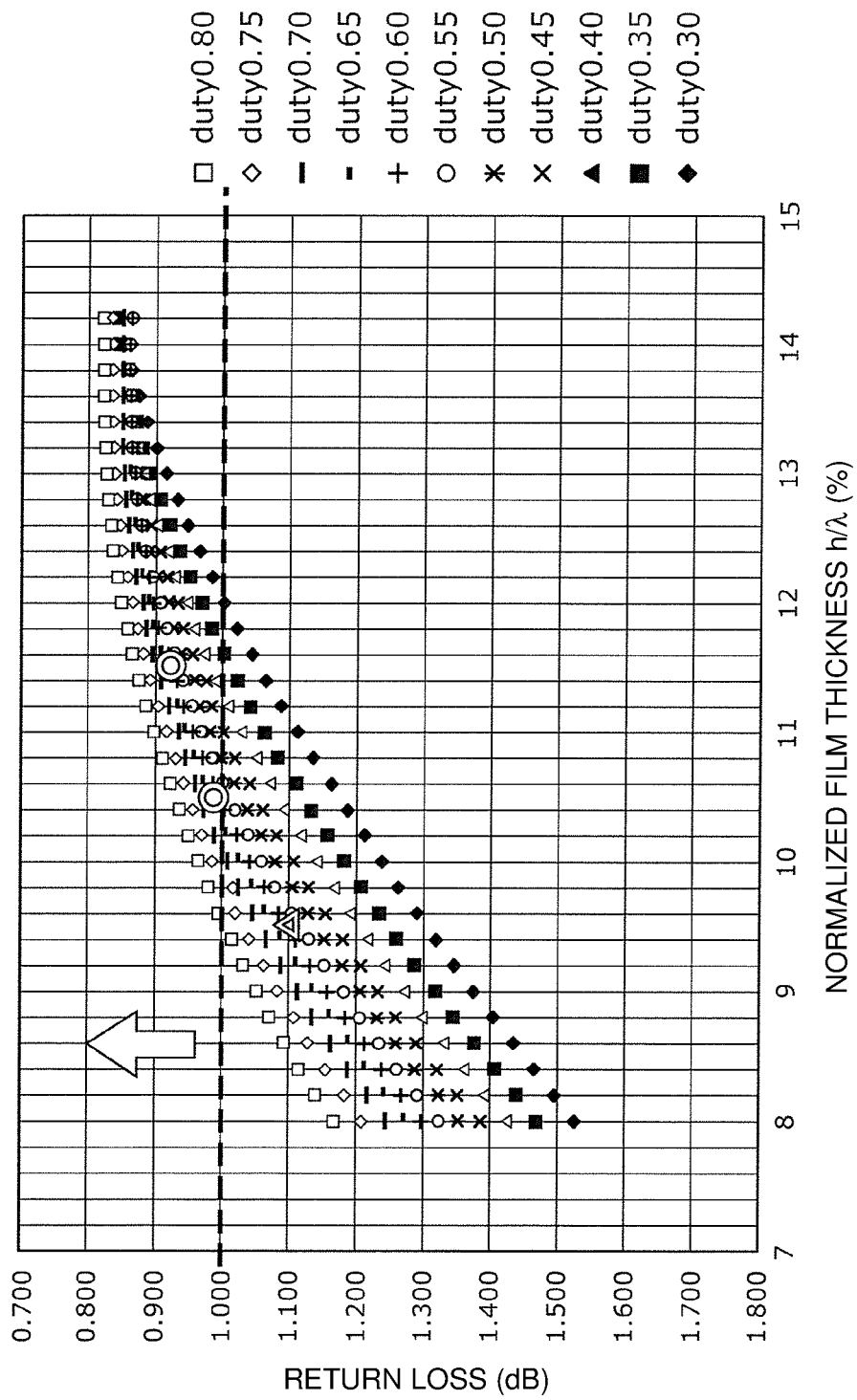

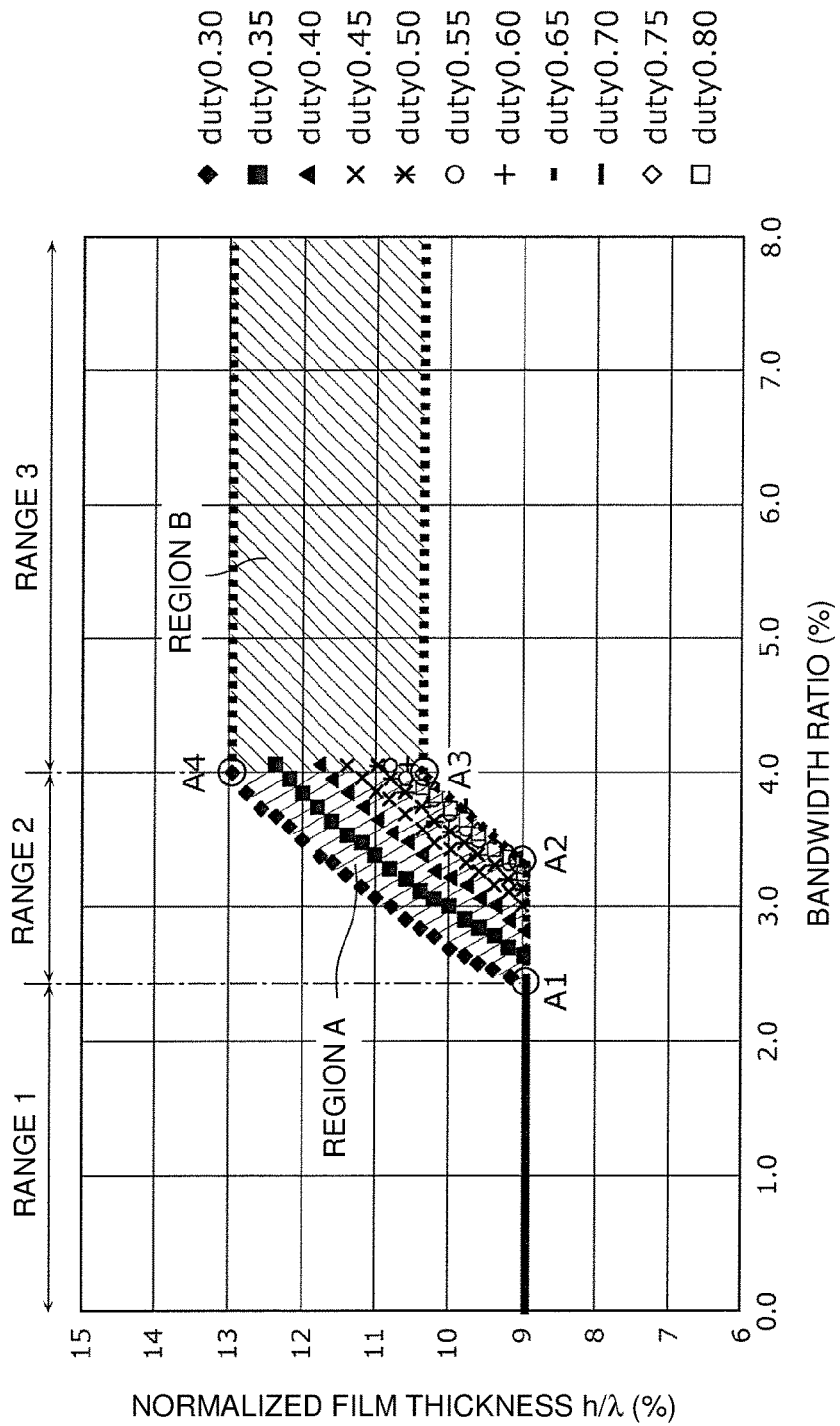

SURFACE ACOUSTIC WAVE FILTER

BACKGROUND OF THE INVENTION

1. Field of the Invention

The present invention relates to surface acoustic wave (SAW) filters that utilize leaky waves.

2. Description of the Related Art

Surface acoustic wave (SAW) filters are practically used as bandpass filters for use in radio frequency (RF) circuits of communication devices and other devices. To efficiently utilize frequency resources for wireless communication, various frequency bands are allocated as communication bands for mobile phones and other devices. Accordingly, SAW filters are designed and developed according to various frequency specifications.

Japanese Unexamined Patent Application Publication No. 2013-102418 discloses a SAW element applicable to a radio frequency band of 2 GHz or higher. Specifically, preferable ranges are set for parameters for interdigital transducer (IDT) electrodes disposed on a piezoelectric substrate such that the film thickness is 7.5% to 8.0% of λ (where λ denotes an IDT electrode pitch) and the line occupancy ratio (duty ratio) is 0.55 to 0.65. As the piezoelectric substrate, a 45°-to-46° Y—X lithium tantalate (LiTaO$_3$) single crystal is used. This SAW element realizes low loss in the passband by utilizing leaky waves even if the frequency band is a radio frequency band of 2 GHz or higher.

To realize low loss in the passband, the film thickness and the line occupancy ratio, which are parameters for the IDT electrodes, are set for the SAW element disclosed in Japanese Unexamined Patent Application Publication No. 2013-102418 so that propagation loss decreases in a range from a resonant frequency to an anti-resonant frequency of resonators of the SAW element. In the case of a narrow band specification, such as the case where the passband width is approximately 2.3% of the center frequency, low loss is realized in the passband of SAW filters by decreasing propagation loss in a range from a resonance point to an anti-resonance point of the resonators as in Japanese Unexamined Patent Application Publication No. 2013-102418.

However, in the case of a wide band specification, such as the case where the passband width is 3% or greater in the bandwidth ratio (passband width/center frequency), the propagation performance of SAW filters over the entire passband is not determined solely by the propagation loss in the range from the resonance point to the anti-resonance point of the resonators. That is, as the passband widens, it becomes more difficult to realize low loss in SAW filters by solely decreasing the propagation loss in the range from the resonance point to the anti-resonance point of the resonators.

SUMMARY OF THE INVENTION

Preferred embodiments of the present invention has been made to address the above-described issues and provide a low-loss surface acoustic wave filter with a wide passband.

To this end, a surface acoustic wave filter according to a preferred embodiment of the present invention includes a LiTaO$_3$ piezoelectric substrate, and interdigital transducer electrodes disposed on the LiTaO$_3$ piezoelectric substrate. The surface acoustic wave filter is a ladder-type surface acoustic wave filter including series resonators and parallel resonators including the interdigital transducer electrodes and utilizes a leaky wave that propagates on the LiTaO$_3$ piezoelectric substrate. A bandwidth ratio that indicates a bandwidth of a passband of the surface acoustic wave filter is about 2.5% or greater, and a cutoff frequency at which bulk wave radiation of a parallel resonator, among the parallel resonators, increases is in a frequency range higher than the passband.

With this configuration, the cutoff frequency at which bulk wave radiation of frequencies higher than an anti-resonant frequency of a parallel resonator increases is successfully shifted to be in a frequency range higher than the passband of the surface acoustic wave filter. Accordingly, insertion loss is reduced on a high frequency side in the passband.

The bandwidth ratio may be about 3.0% or greater.

With this configuration, insertion loss is reduced on a high frequency side in the passband in a range of the duty ratio with which fundamental characteristics, such as a resonance Q value, an anti-resonance Q value, and temperature characteristics of the resonators of the ladder-type surface acoustic wave filter, are satisfied.

A normalized film thickness that is a ratio of a film thickness of the interdigital transducer electrodes of the parallel resonator to a repetitive pitch of a plurality of electrode fingers of the interdigital transducer electrodes of the parallel resonator may be greater than or equal to about 9.0% and less than or equal to about 13.0%. A duty ratio that is a ratio of a line width of the plurality of electrode fingers to a sum of the line width and a space width between the plurality of electrode fingers may be greater than or equal to about 0.3 and less than or equal to about 0.8.

The normalized film thickness and the duty ratio may be in a range of a region A illustrated in FIG. 10.

The cutoff frequency is successfully shifted to be in a frequency range higher than the passband of the surface acoustic wave filter by selecting the normalized film thickness and the duty ratio in these set ranges. Accordingly, insertion loss is reduced on a high frequency side in the passband.

In addition, a surface acoustic wave filter according to another preferred embodiment of the present invention includes a LiTaO$_3$ piezoelectric substrate and interdigital transducer electrodes disposed on the LiTaO$_3$ piezoelectric substrate. The surface acoustic wave filter is a ladder-type surface acoustic wave filter including series resonators and parallel resonators including the interdigital transducer electrodes and utilizes a leaky wave that propagates on the LiTaO$_3$ piezoelectric substrate. A bandwidth ratio that indicates a bandwidth of a passband of the surface acoustic wave filter is about 2.5% or greater, and a return loss in a frequency range higher than a cutoff frequency at which bulk wave radiation of a parallel resonator, among the parallel resonators, increases is about 1.0 dB or less.

With this configuration, return loss in a frequency range higher than the cutoff frequency at which bulk wave radiation increases is successfully made sufficiently low in a frequency region higher than an anti-resonant frequency of a parallel resonator. Accordingly, insertion loss is reduced on a high frequency side in the passband even if the cutoff frequency is in the passband.

The bandwidth ratio may be about 4.0% or greater.

A normalized film thickness that is a ratio of a film thickness of the interdigital transducer electrodes of the parallel resonator to a repetitive pitch of a plurality of electrode fingers of the interdigital transducer electrodes of the parallel resonator may be greater than or equal to about 10.3% and less than or equal to about 13.0%. A duty ratio that is a ratio of a line width of the plurality of electrode fingers to a sum of the line width and a space width between the plurality of electrode fingers may be greater than or equal to about 0.3 and less than or equal to about 0.8.

The normalized film thickness and the duty ratio may be in a range of a region B illustrated in FIG. 10.

Return loss in a frequency range higher than the cutoff frequency is successfully made sufficiently low by selecting the normalized film thickness and the duty ratio in these set ranges. Accordingly, insertion loss is reduced on a high frequency side in the passband even if the cutoff frequency is in the passband.

In addition, a surface acoustic wave filter according to another preferred embodiment of the present invention includes a LiTaO$_3$ piezoelectric substrate and interdigital transducer electrodes disposed on the LiTaO$_3$ piezoelectric substrate. The surface acoustic wave filter is a longitudinally-coupled-resonator-type surface acoustic wave filter including resonators including the interdigital transducer electrodes and utilizes a leaky wave that propagates on the LiTaO$_3$ piezoelectric substrate. A bandwidth ratio that indicates a bandwidth of a passband of the surface acoustic wave filter is about 2.5% or greater, and a cutoff frequency at which bulk wave radiation of a resonator, among the resonators, increases is in a frequency range higher than the passband.

With this configuration, the cutoff frequency due to bulk wave radiation of frequencies higher than an anti-resonant frequency of a resonator is successfully shifted to be in a frequency range higher than the passband of the longitudinally-coupled-resonator-type surface acoustic wave filter. Accordingly, insertion loss is reduced on a high frequency side in the passband.

In addition, a surface acoustic wave filter according to another preferred embodiment of the present invention includes a LiTaO$_3$ piezoelectric substrate and interdigital transducer electrodes disposed on the LiTaO$_3$ piezoelectric substrate. The surface acoustic wave filter is a longitudinally-coupled-resonator-type surface acoustic wave filter including resonators including the interdigital transducer electrodes and utilizes a leaky wave that propagates on the LiTaO$_3$ piezoelectric substrate. A bandwidth ratio that indicates a bandwidth of a passband of the surface acoustic wave filter is about 2.5% or greater, and a return loss in a frequency range higher than a cutoff frequency at which bulk wave radiation of a resonator, among the resonators, increases is about 1.0 dB or less.

With this configuration, return loss in a frequency range higher than the cutoff frequency due to bulk wave radiation of frequencies higher than an anti-resonant frequency of a resonator is successfully made sufficiently low in a longitudinally-coupled-resonator-type surface acoustic wave filter. Accordingly, insertion loss is reduced on a high frequency side in the passband.

The surface acoustic wave filters according to various preferred embodiments of the present invention successfully realize low loss in the passband even when the passband is widened.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 9 is a graph illustrating correlations among a normalized film thickness, a duty ratio, and a return loss.

FIG. 10 is a graph illustrating preferable ranges for the normalized film thickness and the duty ratio for the SAW filter according to a preferred embodiment of the present invention.

DETAILED DESCRIPTION OF THE PREFERRED EMBODIMENTS

Figure 1:
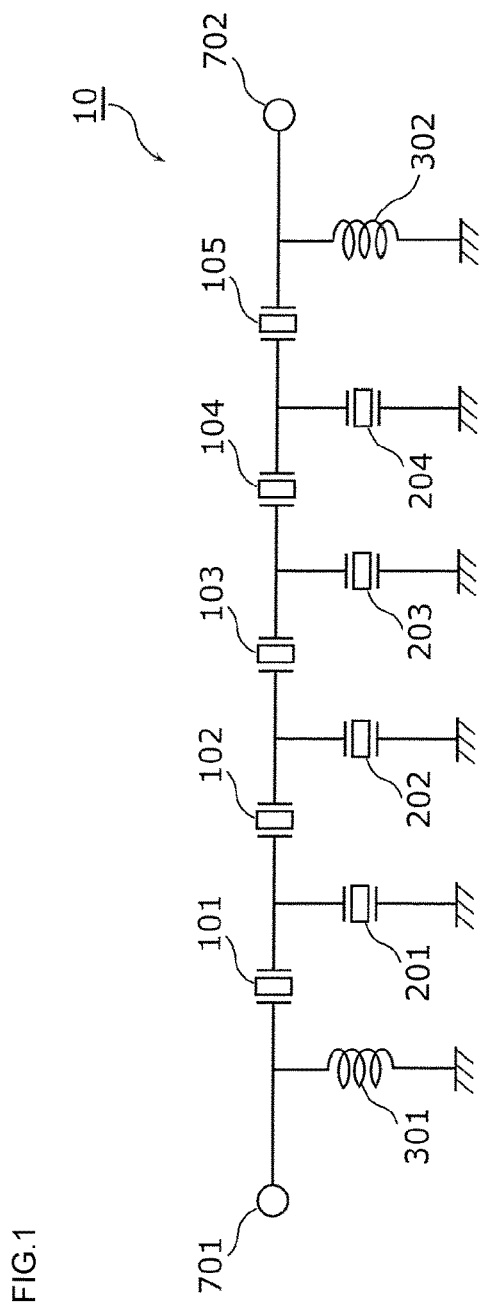
FIG. 1 is a diagram illustrating a circuit structure of a surface acoustic wave (SAW) filter according to a first exemplary preferred embodiment of the present invention.

Preferred embodiments of the present invention will be described in detail below by describing exemplary preferred embodiments and corresponding drawings. Note that the exemplary preferred embodiments described below each describe general or specific examples. Numerical values, shapes, materials, components, arrangements and connections of the components described in the exemplary preferred embodiments below are merely examples and do not limit the present invention. Components not mentioned in the independent claims from among components mentioned in the exemplary preferred embodiments below will be described as optional components. In addition, dimensions of the components or dimension ratios of the components in the drawings do not strictly indicate the actual dimensions or dimension ratios.

First Exemplary Preferred Embodiment

A basic structure of a SAW filter according to a first exemplary preferred embodiment of the present invention will be described. In the first exemplary preferred embodiment, a bandpass SAW filter used as a narrow band filter (passband: 2555-2655 MHz, bandwidth ratio: 3.84%) for Band 41 of the time-division Long Term Evolution (TD-LTE) standard will be described by way of example. Note that the "bandwidth ratio" is defined herein as a value ($B_w/f_0$) obtained by dividing the passband width $B_w$ by the center frequency $f_0$.

FIG. 1 is a diagram illustrating a circuit structure of a SAW filter 10 according to the first exemplary preferred embodiment. As illustrated in FIG. 1, the SAW filter 10 includes series resonators 101 to 105, parallel resonators 201 to 204, matching inductances 301 and 302, an input terminal 701, and an output terminal 702.

The series resonators 101 to 105 are connected in series to one another between the input terminal 701 and the output terminal 702. The parallel resonators 201 to 204 are connected parallel to each other between a reference terminal (ground) and a corresponding contact point between the series resonators 101 to 105 between the input terminal 701 and the output terminal 702. Because of the above-described connections of the series resonators 101 to 105 and the parallel resonators 201 to 204, the SAW filter 10 is a ladder-type bandpass filter. The matching inductance 301 is connected between the input terminal 701 and a reference terminal, and the matching inductance 302 is connected between the output terminal 702 and a reference terminal.

Figure 2:
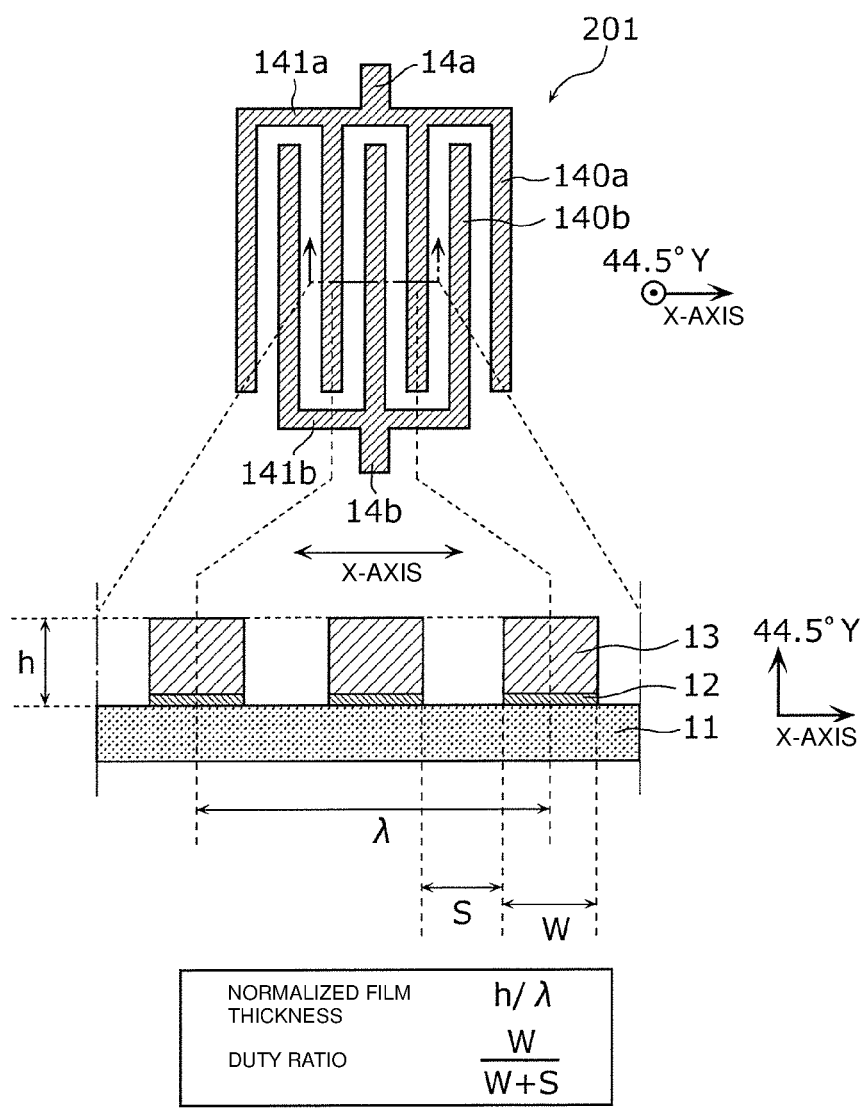
FIG. 2 shows a plan view and a cross-sectional view schematically illustrating a resonator of the SAW filter according to the first exemplary preferred embodiment of the present invention.

FIG. 2 shows a plan view and a cross-sectional view schematically illustrating a resonator of the SAW filter 10 according to the first exemplary preferred embodiment. In FIG. 2, a schematic plan view and a schematic cross-sectional view of a structure of the parallel resonator 201 are illustrated among the plurality of resonators of the SAW filter 10. Note that the parallel resonator 201 illustrated in FIG. 2 is selected for merely describing a typical structure of the plurality of resonators, and the number of electrode fingers of an electrode and the length of the electrode fingers are not limited to this example.

Each of the resonators of the SAW filter 10 includes a piezoelectric substrate 11 and interdigital transducer (IDT) electrodes 14a and 14b.

The piezoelectric substrate 11 is preferably made of a 44.5° Y—X lithium tantalate ($LiTaO_3$) piezoelectric single crystal or piezoelectric ceramic ($LiTaO_3$ single crystal or ceramic which is cut at a plane whose normal makes a rotation angle of 44.5° with the Y-axis about the X-axis and on which a surface acoustic wave propagates in the X-axis direction).

As illustrated in the plan view in FIG. 2, a pair of opposing IDT electrodes 14a and 14b is disposed on the piezoelectric substrate 11. The IDT electrode 14a includes a plurality of electrode fingers 140a, which are parallel or substantially parallel to one another, and a busbar electrode 141a that connects the plurality of electrode fingers 140a to one another. The IDT electrode 14b includes a plurality of electrode fingers 140b, which are parallel or substantially parallel to one another, and a busbar electrode 141b that connects the plurality of electrode fingers 140b to one another. The plurality of electrode fingers 140a and 140b are disposed in a direction perpendicular or substantially perpendicular to the X-axis direction.

As illustrated in the cross-sectional view in FIG. 2, the plurality of electrode fingers 140a and 140b and the busbar electrodes 141a and 141b have a layered structure including an adhesion-enhancing layer 12 and a main electrode 13. The adhesion-enhancing layer 12 is a layer that enhances adhesion between the piezoelectric substrate 11 and the main electrode 13. For example, titanium (Ti) is used as a material for the adhesion-enhancing layer 12. For example, aluminum (Al) is used as a material for the main electrode 13. Note that the materials for the main electrode 13 and the adhesion-enhancing layer 12 are not limited to the above-described metal materials. Further, the IDT electrodes 14a and 14b do not necessarily need to have the layered structure including the adhesion-enhancing layer 12 and the main electrode 13. For example, the IDT electrodes 14a and 14b may be formed of a metal, such as Ti, Al, copper (Cu), platinum (Pt), gold (Au), silver (Ag), or palladium (Pd), or an alloy; or a multilayer body formed of any of the aforementioned metals or the alloy. In addition, to protect the electrodes or to improve the characteristics, a dielectric film covering the adhesion-enhancing layer 12 and the main electrode 13 may be disposed on the piezoelectric substrate 11.

A SAW filter according to a preferred embodiment of the present invention preferably has ranges of parameters for IDT electrodes that ensure low loss even in a wider passband. Here, the parameters for the IDT electrodes are a normalized film thickness and a duty ratio. The normalized film thickness is defined by $h/\lambda$, where h denotes a film thickness of the IDT electrodes 14a and 14b illustrated in FIG. 2 and $\lambda$ denotes a pitch of the IDT electrode 14a or 14b. In addition, the duty ratio is a line occupancy ratio of the plurality of electrode fingers 140a and 140b, specifically, a ratio of a line width of the plurality of electrode fingers 140a and 140b to a sum of the line width and a space width between the plurality of electrode fingers 140a and 140b. More specifically, the duty ratio is defined by $W/(W+S)$, where W denotes the line width of the electrode fingers 140a and 140b of the IDT electrodes 14a and 14b, respectively, and S denotes the space width between the adjacent electrode fingers 140a and 140b.

The SAW filter 10 according to the first exemplary preferred embodiment preferably has a normalized film thickness ($h/\lambda$) of about 10.3% and a duty ratio of about 0.60, for example.

Table 1 shows details of design parameters (capacitance and wavelength) of the series resonators 101 to 105, the parallel resonators 201 to 204, and the matching inductances 301 and 302 of the SAW filter 10 according to the first exemplary preferred embodiment.

TABLE 1

| | Series resonator 101 | Series resonator 102 | Series resonator 103 | Series resonator 104 | Series resonator 105 |
|---|---|---|---|---|---|
| Capacitance (pF) | 1.86 | 0.69 | 0.75 | 0.69 | 2.01 |
| Wavelength (μm) | 1.465 | 1.467 | 1.468 | 1.462 | 1.465 |

TABLE 1-continued

|  | Parallel resonator 201 | Parallel resonator 202 | Parallel resonator 203 | Parallel resonator 204 |
|---|---|---|---|---|
| Capacitance (pF) | 1.63 | 1.18 | 0.75 | 1.38 |
| Wavelength (μm) | 1.547 | 1.528 | 1.524 | 1.545 |

|  | Matching inductance 301 | — | Matching inductance 302 |
|---|---|---|---|
| Inductance (nH) | 7.0 | — | 7.0 |

The wavelength of each of the resonators shown in Table 1 is determined by the pitch λ of the IDT electrode 14a or 14b illustrated in FIG. 2. In addition, the capacitance of each of the resonators shown in Table 1 is determined by factors, such as the length, the space width S, and the line width W of the electrode fingers 140a and 140b and a dielectric constant of the piezoelectric substrate 11.

In the first exemplary preferred embodiment, a T-section ladder-type filter preferably includes the nine resonators; however, a π-section ladder-type filter may be provided. In addition, the number of resonators is not limited to nine.

A principle of operation of the ladder-type SAW filter 10 according to the first exemplary preferred embodiment will be described next.

The parallel resonators 201 to 204 each have resonance characteristics of a resonant frequency frp and an anti-resonant frequency fap (>frp). In addition, the series resonators 101 to 105 each have resonance characteristics of a resonant frequency frs and an anti-resonant frequency fas (>frs>frp). Note that the series resonators 101 to 105 have substantially the same resonant frequency frs; however, the resonant frequency frs does not necessarily need to be equal because design parameters for the individual resonators are different as shown in Table 1. The same applies to the anti-resonant frequency fas of the series resonators 101 to 105 and the resonant frequency frp and the anti-resonant frequency fap of the parallel resonators 201 to 204. That is, each of these frequencies does not necessarily need to be equal.

To provide a bandpass filter by using resonators arranged in a ladder-type shape, the anti-resonant frequency fap of the parallel resonators 201 to 204 and the resonant frequency frs of the series resonators 101 to 105 are set to be close to each other. With this configuration, a region near the resonant frequency frp at which the impedance of the parallel resonators 201 to 204 becomes closer to 0 serves as a lower stopband. If the frequency becomes higher than the resonant frequency frp, the impedance of the parallel resonators 201 to 204 increases at around the anti-resonant frequency fap and the impedance of the series resonators 101 to 105 becomes closer to 0 at around the resonant frequency frs. Consequently, a range from the anti-resonant frequency fap to the resonant frequency frs serves as a signal passband in a signal path from the input terminal 701 to the output terminal 702. If the frequency further increases and becomes closer to the anti-resonant frequency fas, the impedance of the series resonators 101 to 105 increases and a region near the anti-resonant frequency fas serves as a higher stopband.

When a radio frequency signal is input via the input terminal 701 to the SAW filter 10 having the structure illustrated in FIGS. 1 and 2 and the principle of operation, the radio frequency signal causes a potential difference between the input terminal 701 and the reference terminal. This potential difference causes the piezoelectric substrate 11 to distort, and consequently a surface acoustic wave that propagates in the X-axis direction occurs. The pitch λ of the IDT electrodes 14a and 14b is set to be equal or substantially equal to the wavelength of the passband. This configuration allows a radio frequency signal having a desired frequency component alone to pass through the SAW filter 10.

Figure 3:
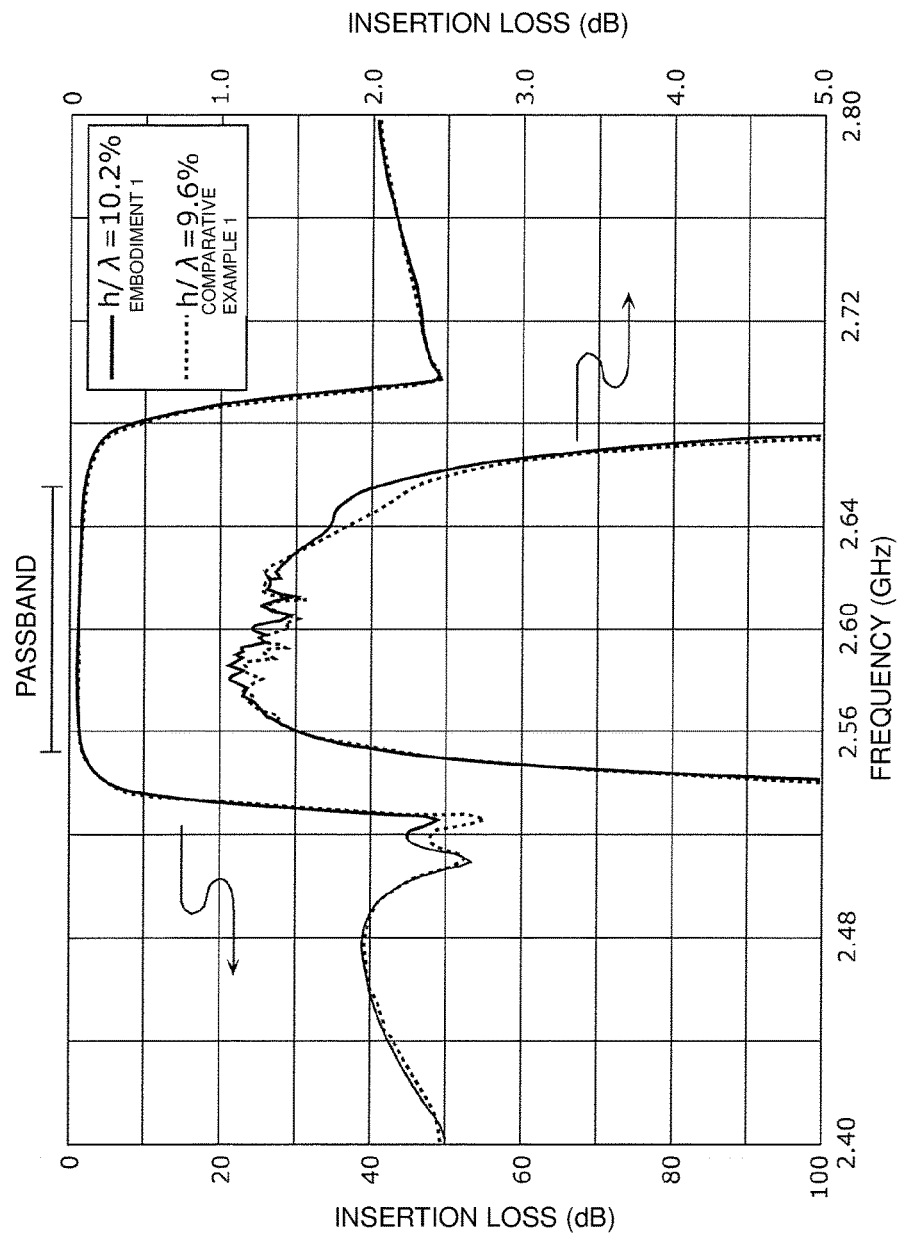
FIG. 3 is a graph illustrating bandpass characteristics of the SAW filter according to the first exemplary preferred embodiment of the present invention and a SAW filter according to a first comparative example in comparison.

FIG. 3 is a graph illustrating bandpass characteristics of the SAW filter according to the first exemplary preferred embodiment and a SAW filter according to a first comparative example in comparison. The graph of FIG. 3 illustrates insertion-loss-frequency characteristics of the SAW filter 10 (having the normalized film thickness h/λ of about 10.2%) according to the first exemplary preferred embodiment and the SAW filter (having a normalized film thickness h/λ of about 9.6%) according to the first comparative example. Note that the term "insertion loss" used in the first exemplary preferred embodiment refers to a ratio of an output power at the output terminal 702 to an input power at the input terminal 701 expressed in decibels (dB). The bandpass characteristics illustrated in FIG. 3 indicate that the SAW filter 10 (having the normalized film thickness h/λ of about 10.2%) according to the first exemplary preferred embodiment successfully makes loss lower than that of the SAW filter (having the normalized film thickness h/λ of about 9.6%) according to the first comparative example on a high frequency side in the passband. Factors of this consequence will be described with reference to FIGS. 4A and 4B.

Figure 4A:
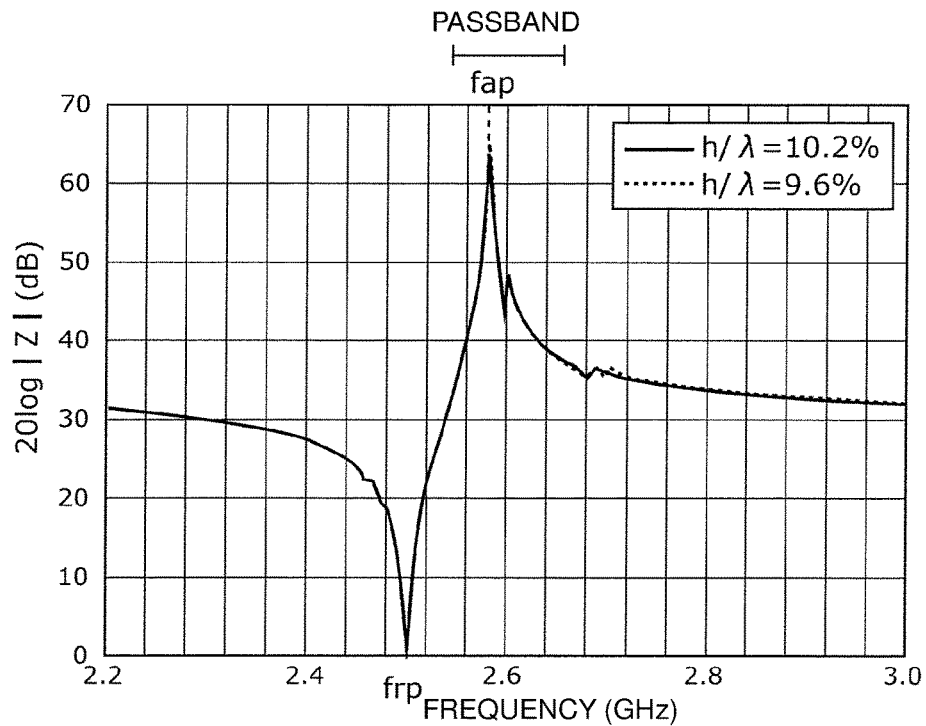
FIG. 4A is a graph illustrating impedance-frequency characteristics of a parallel resonator according to the first exemplary preferred embodiment of the present invention and a parallel resonator according to the first comparative example in comparison.
Figure 4B:
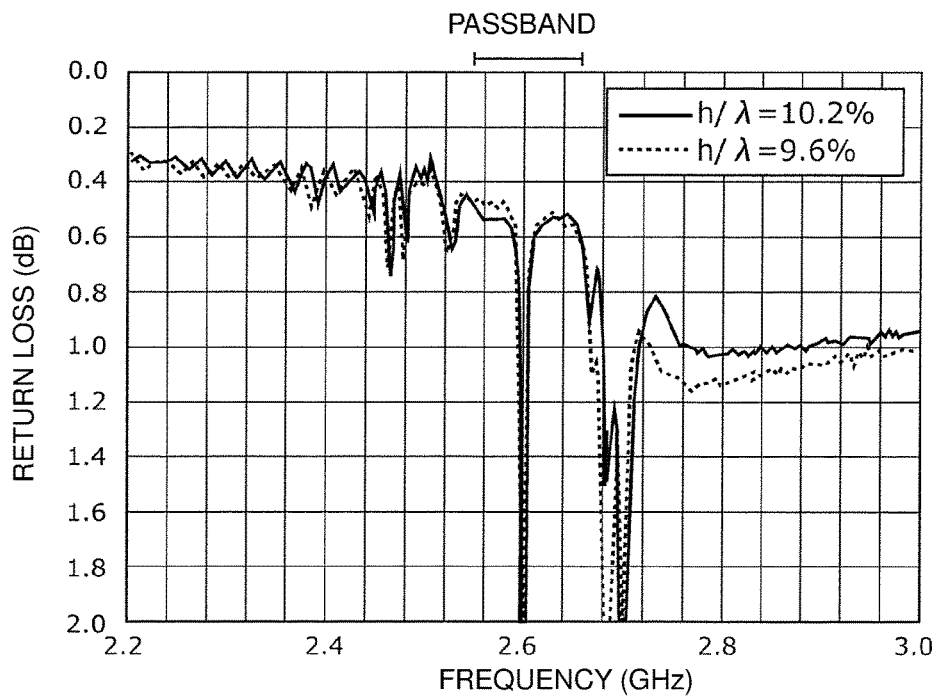
FIG. 4B is a graph illustrating return-loss-frequency characteristics of the parallel resonator according to the first exemplary preferred embodiment of the present invention and the parallel resonator in the first comparative example in comparison.

FIG. 4A is a graph illustrating impedance-frequency characteristics of the parallel resonator 201 according to the first exemplary preferred embodiment and a parallel resonator according to the first comparative example in comparison. FIG. 4B is a graph illustrating return-loss-frequency characteristics of the parallel resonator 201 according to the first exemplary preferred embodiment and the parallel resonator according to the first comparative example in comparison. In FIGS. 4A and 4B, impedances (=20 log|Z|) and return losses (dB) of the parallel resonator included in the SAW filter (having the normalized film thickness h/λ of about 9.6%) according to the first comparative example and the parallel resonator 201 included in the SAW filter 10 (having the normalized film thickness h/λ of about 10.2%) according to the first exemplary preferred embodiment are compared with each other, respectively. The term "return loss" used in the first exemplary preferred embodiment refers to a ratio of a reflected power from the parallel resonator 201 to an input power to the parallel resonator 201 expressed in decibels (dB).

FIGS. 4A and 4B indicate that, in a range from the resonant frequency frp (where the impedance takes a local minimum) to the anti-resonant frequency fap (where the impedance takes a local maximum), both the first comparative example (the normalized film thickness h/λ of about 9.6%) and the first exemplary preferred embodiment (the normalized film thickness h/λ of about 10.2%) have return losses of approximately 0.6 dB or lower, that is, good reflection characteristics.

In contrast, in a frequency region higher than approximately 2.66 GHz, which is close to the higher frequency end of the passband, the first exemplary preferred embodiment has a better return loss than the first comparative example. A difference in the return loss in the frequency region higher than this higher frequency end greatly affects a difference in the insertion loss on a high frequency side in the passband.

The return loss deteriorates in a frequency range higher than the anti-resonant frequency fap because a leakage component (bulk wave radiation) of surface acoustic waves to inside of the piezoelectric substrate 11 increases. It was discovered by the inventors that as the normalized film thickness h/λ increases, the cutoff frequency $f_{BR}$ due to bulk wave radiation becomes higher and the level of the bulk wave radiation decreases. The cutoff frequency $f_{BR}$ due to the bulk wave radiation is defined to be a frequency at which the acoustic velocity of the surface acoustic wave exceeds the acoustic velocity of the bulk wave and a loss due to the bulk wave starts to increase.

The cutoff frequency $f_{BR}$ is substantially equal to 2.73 GHz in the first exemplary preferred embodiment, whereas the cutoff frequency $f_{BR}$ is substantially equal to 2.72 GHz in the first comparative example.

A typical existing narrow-band SAW filter (of a bandwidth ratio of about 2.3% or less) has the cutoff frequency $f_{BR}$ due to bulk wave radiation that is in an attenuation band sufficiently higher than the passband of the SAW filter. Accordingly, insertion loss of the SAW filter is substantially determined by loss in a range from the resonant frequency to the anti-resonant frequency of resonators included in this SAW filter, and the preferable range for the normalized film thickness h/λ and the preferable range for the duty ratio are 7.5% to 8.0% and 0.55 to 0.65, respectively (for example, Japanese Unexamined Patent Application Publication No. 2013-102418).

However, as the passband of the SAW filter widens, the cutoff frequency $f_{BR}$ due to bulk wave radiation comes to be located in the passband. As a result, the insertion loss deteriorates in the passband.

To reduce the insertion loss in the passband of the SAW filter from this viewpoint, it is necessary to set the normalized film thickness and the duty ratio by considering particularly the influence of bulk wave radiation at the parallel resonators as well as reduction of propagation loss in the range from the resonant frequency to the anti-resonant frequency of the resonators.

Figure 5:
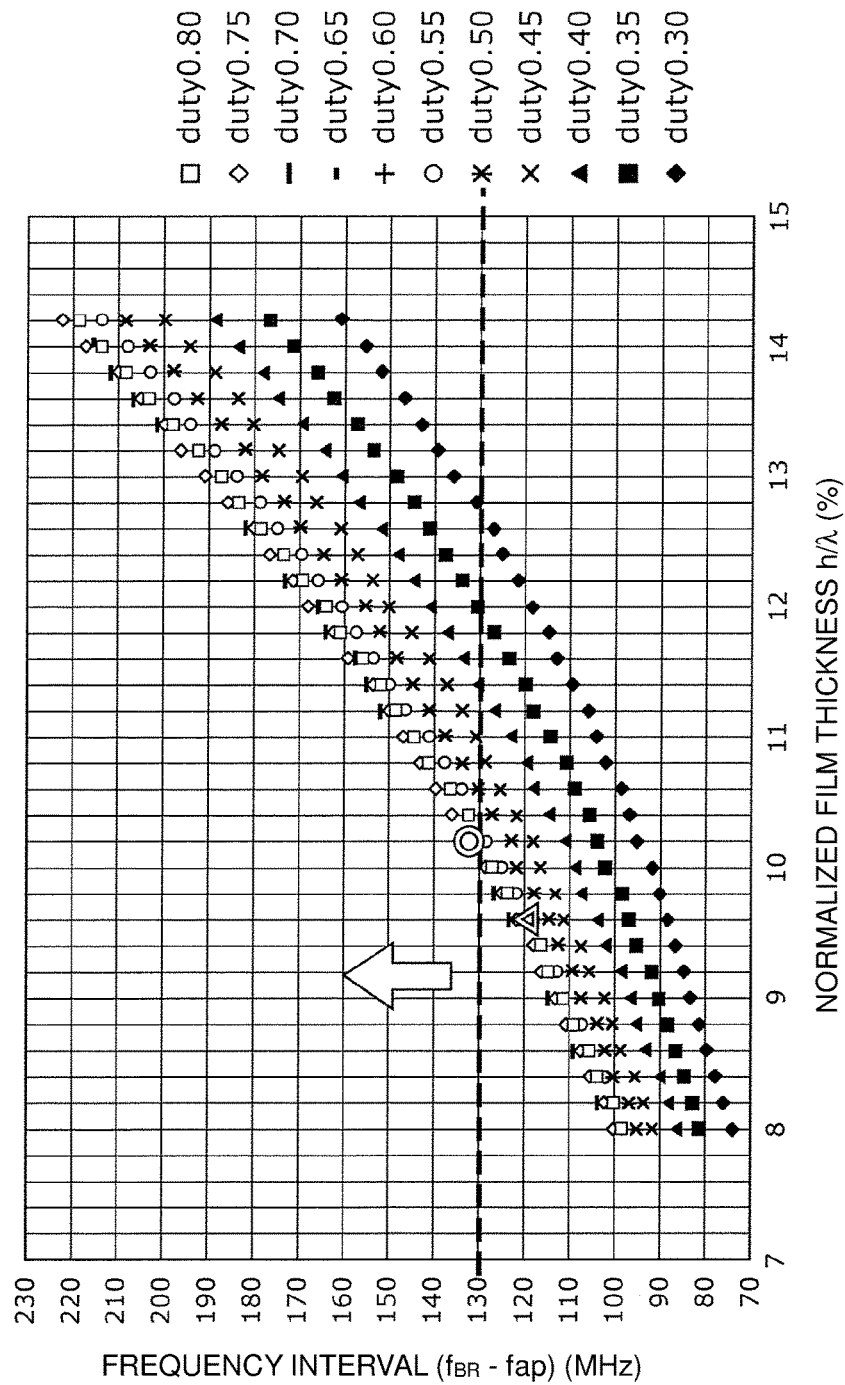
FIG. 5 is a graph illustrating correlations among a normalized film thickness, a duty ratio, and a cutoff frequency due to bulk wave radiation.

FIG. 5 is a graph illustrating correlations among the normalized film thickness, the duty ratio, and the cutoff frequency $f_{BR}$ due to bulk wave radiation. Specifically, FIG. 5 illustrates a result of finite-element-method-based simulation used to analyze how the frequency interval ($f_{BR}$-fap) between the cutoff frequency $f_{BR}$ due to bulk wave radiation and the anti-resonant frequency fap of the parallel resonator 201 changes when the normalized film thickness and the duty ratio are changed.

As illustrated in FIG. 5, the frequency interval ($f_{BR}$-fap) increases as the normalized film thickness h/λ increases when the graph is viewed by assuming that the duty ratio (about 0.30 to about 0.80) is constant. In addition, the frequency interval ($f_{BR}$-fap) increases as the duty ratio increases when the graph is viewed by assuming that the normalized film thickness h/λ (about 8.0 to about 14.2) is constant. This indicates that the cutoff frequency $f_{BR}$ due to bulk wave radiation becomes higher as the duty ratio and the normalized film thickness h/λ increases.

In the case of the SAW filter 10 (having a bandwidth ratio of about 3.84%) according to the first exemplary preferred embodiment, the frequency interval ($f_{BR}$-fap) with which the cutoff frequency $f_{BR}$ due to bulk wave radiation is shifted to be in the attenuation band higher than the passband is approximately 130 MHz or larger. This frequency interval ($f_{BR}$-fap) changes depending on the bandwidth ratio of the SAW filter 10. For example, in the case where the bandwidth ratio of the SAW filter is about 4%, the frequency interval ($f_{BR}$-fap) needed is approximately 155 MHz; in the case where the bandwidth ratio is about 5%, the frequency interval ($f_{BR}$-fap) needed is approximately 195 MHz; and in the case where the bandwidth ratio is about 6%, the frequency interval ($f_{BR}$-fap) needed is approximately 235 MHz. That is, it is necessary to set the frequency interval ($f_{BR}$-fap) larger as the passband width $B_w$ of the SAW filter increases.

The graph of FIG. 5 includes a double circle indicating the SAW filter 10 (having the normalized film thickness h/λ of about 10.2%) according to the first exemplary preferred embodiment and a double triangle indicating the SAW filter (having the normalized film thickness h/λ of 9.6%) according to the first comparative example.

As described above, the influence of the loss caused by bulk wave radiation is successfully reduced in the passband by increasing the normalized film thickness and the duty ratio; however, a resonance quality (Q) value, an anti-resonance Q value, and temperature characteristics of each of the resonators tend to worsen as the normalized film thickness and the duty ratio increase. Further, to ensure the accuracy in processing the IDT electrodes in the fabrication process, an upper-limit value and a lower-limit value are set for each of the normalized film thickness and the duty ratio. From these viewpoints, it is preferable that the normalized film thickness h/λ of the SAW filter 10 according to the first exemplary preferred embodiment is set to be greater than or equal to about 8% and less than or equal to about 14% and that the duty ratio is set to be greater than or equal to about 0.30 and less than or equal to about 0.80.

As described above, when the bandwidth ratio of the SAW filter becomes larger than approximately 2.3%, insertion loss in the passband is not determined solely by the propagation loss in a range from the resonant frequency to the anti-resonant frequency of resonators and is greatly affected by loss caused by bulk wave radiation at frequencies higher than the anti-resonant frequency.

The ladder-type SAW filter 10 according to the first exemplary preferred embodiment utilizes a leaky wave that propagates on the piezoelectric substrate 11 preferably made of a 44.5° Y—X LiTaO₃ single crystal and includes the series resonators 101 to 105 and the parallel resonators 201 to 204 each defined by two opposing IDT electrodes 14a and 14B disposed on the piezoelectric substrate 11. The ladder-type SAW filter has a bandwidth ratio of about 2.5% or greater, and the cutoff frequency $f_{BR}$ due to bulk wave radiation of the parallel resonator 201 is in a frequency range higher than the passband of the ladder-type SAW filter.

With such a configuration, the cutoff frequency $f_{BR}$ due to bulk wave radiation of frequencies higher than the anti-resonant frequency fap of the parallel resonator 201 is successfully shifted to be in a frequency range higher than the passband of the SAW filter. Accordingly, the insertion loss is reduced on a high frequency side in the passband.

Note that a 44.5° Y—X LiTaO₃ single crystal is preferably used as the piezoelectric substrate 11 according to the first exemplary preferred embodiment; however, the cut angle of the single crystal material is not limited to this particular angle. That is, the cut angle of a piezoelectric substrate of the SAW filter that uses a LiTaO₃ substrate as the piezoelectric substrate, utilizes leaky surface acoustic waves, and has the cutoff frequency $f_{BR}$ due to bulk wave radiation of a parallel resonator that is in a frequency range higher than the passband in the case of a bandwidth ratio of about 2.5% or greater is not limited to 44.5° Y. Even a SAW filter using a LiTaO₃ piezoelectric substrate cut at a cut angle other than the above one may exert the similar advantageous effects.

Second Exemplary Preferred Embodiment

In a second exemplary preferred embodiment of the present invention, preferable conditions for the normalized film thickness and the duty ratio of a SAW filter having a bandwidth ratio greater than that of the first exemplary preferred embodiment will be described.

A basic structure of a SAW filter according to the second exemplary preferred embodiment of the present invention will be described. In the second exemplary preferred embodiment, a bandpass SAW filter used as a full band filter (passband: 2496-2690 MHz, bandwidth ratio: 7.46%) for Band 41 of the TD-LTE standard will be described by way of example.

Figure 6:
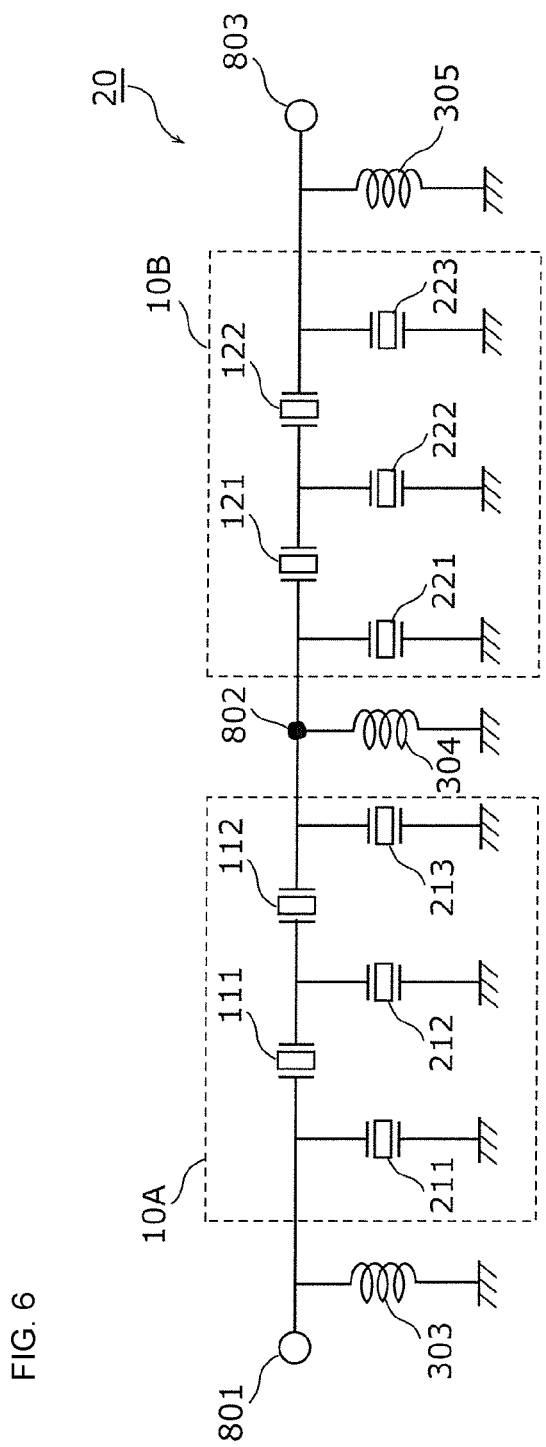
FIG. 6 is a diagram illustrating a circuit structure of a SAW filter according to a second exemplary preferred embodiment of the present invention.

FIG. 6 is a diagram illustrating a circuit structure of a SAW filter 20 according to the second exemplary preferred embodiment. As illustrated in FIG. 6, the SAW filter 20 includes ladder-type circuits 10A and 10B, matching inductances 303, 304, and 305, an input terminal 801, an intermediate terminal 802, and an output terminal 803. The ladder-type circuit 10A includes series resonators 111 and 112 and parallel resonators 211 to 213. The ladder-type circuit 10B includes series resonators 121 and 122 and parallel resonators 221 to 223.

The ladder-type circuits 10A and 10B are connected in series to each other with the intermediate terminal 802 interposed therebetween. The series resonators 111, 112, 121, and 122 are connected in series to one another between the input terminal 801 and the output terminal 803. In addition, the parallel resonators 211, 212, 213, 221, 222, and 223 are connected parallel to one another between a reference terminal (ground) and respective contact points between the input terminal 801, the series resonators 111 and 112, the intermediate terminal 802, the series resonators 121 and 122, and the output terminal 803. Because of such connections, the SAW filter 20 is a ladder-type bandpass filter. The matching inductances 303 to 305 are each connected between the reference terminal and a corresponding one of the input terminal 801, the intermediate terminal 802, and the output terminal 803.

The basic structure of IDT electrodes and the piezoelectric substrate that define the resonators are substantially the same as that illustrated in FIG. 2. Specifically, the pair of opposing IDT electrodes 14a and 14b are disposed on the piezoelectric substrate 11. The piezoelectric substrate 11 is preferably made of a 44.5° Y—X LiTaO₃ piezoelectric single crystal or piezoelectric ceramic. In addition, the layered structure of the IDT electrodes 14a and 14b is substantially the same as that of the first exemplary preferred embodiment.

The SAW filter 20 according to the second exemplary preferred embodiment has a normalized film thickness h/λ of about 10.5% (in a second exemplary preferred embodiment A) and of about 11.5% (in a second exemplary preferred embodiment B) and has a duty ratio of about 0.60.

Table 2 shows details of design parameters (capacitance and wavelength) of the series resonators 111, 112, 121, and 122, the parallel resonators 211, 212, 213, 221, 222, and 223, and the matching inductances 303, 304, and 305 of the SAW filter 20 according to the second exemplary preferred embodiment.

TABLE 2

|  | Series resonator 111 | Series resonator 112 | Series resonator 121 | Series resonator 122 |
|---|---|---|---|---|
| Capacitance (pF) | 1.6 | 2.5 | 2.5 | 1.6 |
| Wavelength (μm) | 1.400 | 1.413 | 1.406 | 1.405 |

|  | Parallel resonator 211 | Parallel resonator 212 | Parallel resonator 213 | Parallel resonator 221 | Parallel resonator 222 | Parallel resonator 223 |
|---|---|---|---|---|---|---|
| Capacitance (pF) | 2.3 | 1.2 | 1.6 | 1.6 | 1.2 | 2.3 |
| Wavelength (μm) | 1.551 | 1.542 | 1.562 | 1.556 | 1.538 | 1.584 |

|  | Matching inductance 303 | Matching inductance 304 | Matching inductance 305 |
|---|---|---|---|
| Inductance (nH) | 1.9 | 1.5 | 1.9 |

The wavelength of each of the resonators shown in Table 2 is determined by the pitch λ of the IDT electrode 14a or 14b illustrated in FIG. 2. In addition, the capacitance of each of the resonators shown in Table 2 is determined by factors, such as the length, the space width S, and the line width W of the electrode fingers 140a and 140b and a dielectric constant of the piezoelectric substrate 11.

In the second exemplary preferred embodiment, the ladder-type circuits 10A and 10B define a π-section ladder-type circuit; however, the ladder-type circuits 10A and 10B may define a T-section ladder-type circuit. In addition, three or more ladder-type circuits may be connected to one another.

Since the principle of operation of the ladder-type SAW filter 20 according to the second exemplary preferred embodiment is substantially the same as that of the ladder-type SAW filter 10 according to the first exemplary preferred embodiment, a description thereof is omitted.

When a radio frequency signal is input to the SAW filter 20 having the structure illustrated in FIG. 6 via the input terminal 801, the radio frequency signal causes a potential difference between the input terminal 801 and the reference terminal. This potential difference causes the piezoelectric substrate 11 to distort, and consequently a surface acoustic wave that propagates in the X-axis direction occurs. The pitch λ of the IDT electrodes 14a and 14b is set to be equal or substantially equal to the wavelength of the passband. This configuration allows a radio frequency signal having a desired frequency component alone to pass through the SAW filter 20.

Figure 7:
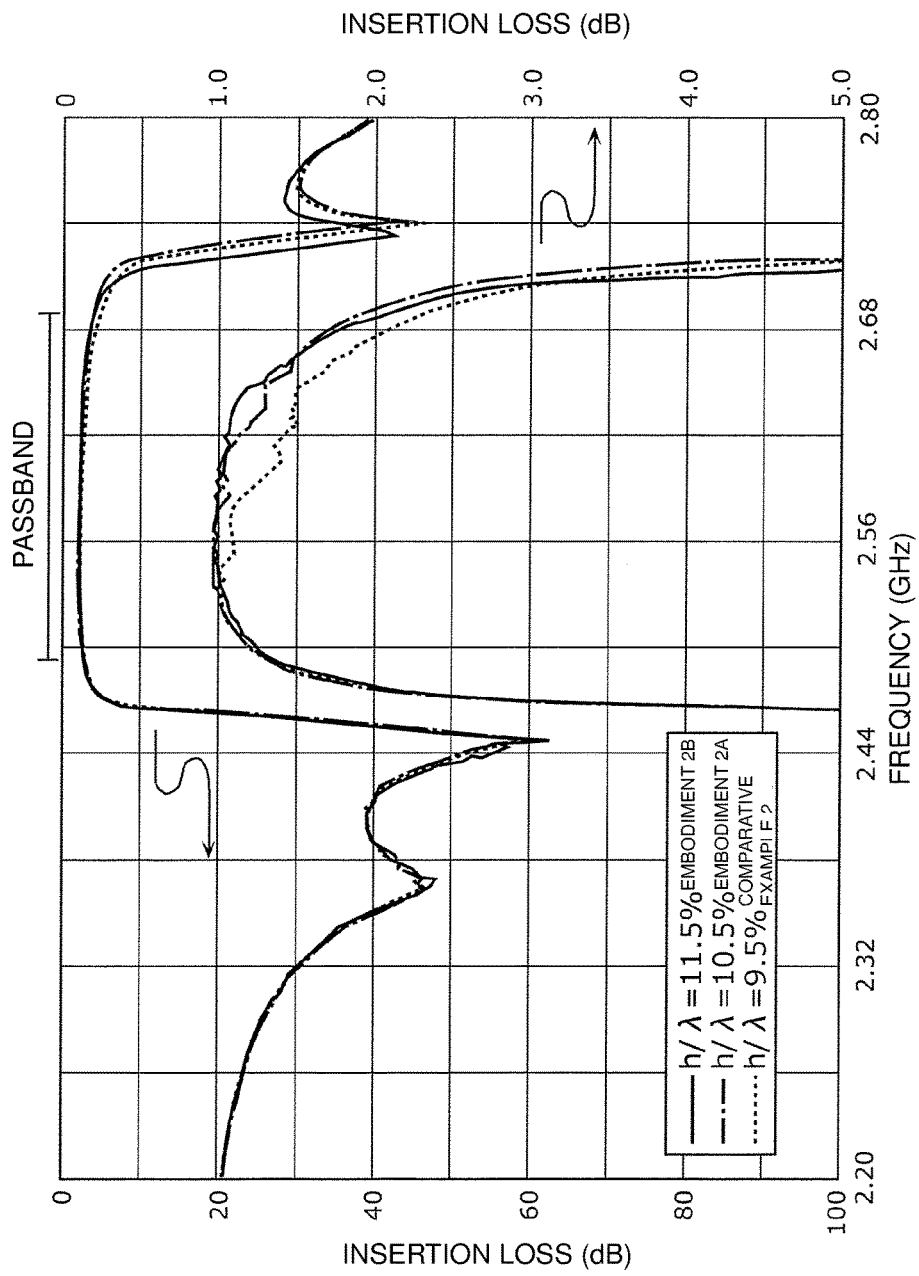
FIG. 7 is a graph illustrating bandpass characteristics of the SAW filter according to the second exemplary preferred embodiment of the present invention and a SAW filter according to a second comparative example.

FIG. 7 is a graph illustrating bandpass characteristics of the SAW filter 20 according to the second exemplary preferred embodiment and a SAW filter according to a second comparative example in comparison. The graph of FIG. 7 illustrates insertion-loss-frequency characteristics of the SAW filter 20 (having the normalized film thickness h/λ of about 10.5%) according to the second exemplary preferred embodiment A, the SAW filter 20 (having the normalized film thickness h/λ of about 11.5%) according to the second exemplary preferred embodiment B, and the SAW filter (having a normalized film thickness h/λ of about 9.5%) according to the second comparative example. Note that the term "insertion loss" used in the second exemplary preferred embodiment refers to a ratio of an output power at the output terminal 803 to an input power at the input terminal 801 expressed in decibels (dB). The bandpass characteristics illustrated in FIG. 7 indicate that the SAW filter 20 (having the normalized film thickness h/λ of about 10.5% or greater) according to the second exemplary preferred embodiment A and the second exemplary preferred embodiment B successfully makes the loss lower than that of the SAW filter (having the normalized film thickness h/λ of about 9.5%) according to the second comparative example on a high frequency side in the passband. Factors of this consequence will be described with reference to FIGS. 8A and 8B.

Figure 8A:
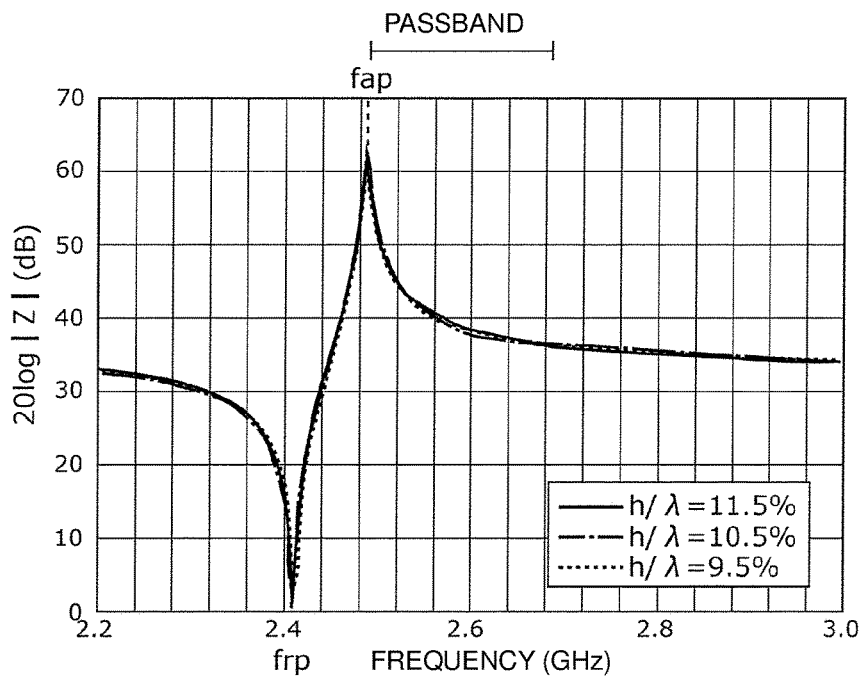
FIG. 8A is a graph illustrating impedance-frequency characteristics of a parallel resonator according to the second exemplary preferred embodiment of the present invention and a parallel resonator according to the second comparative example in comparison.
Figure 8B:
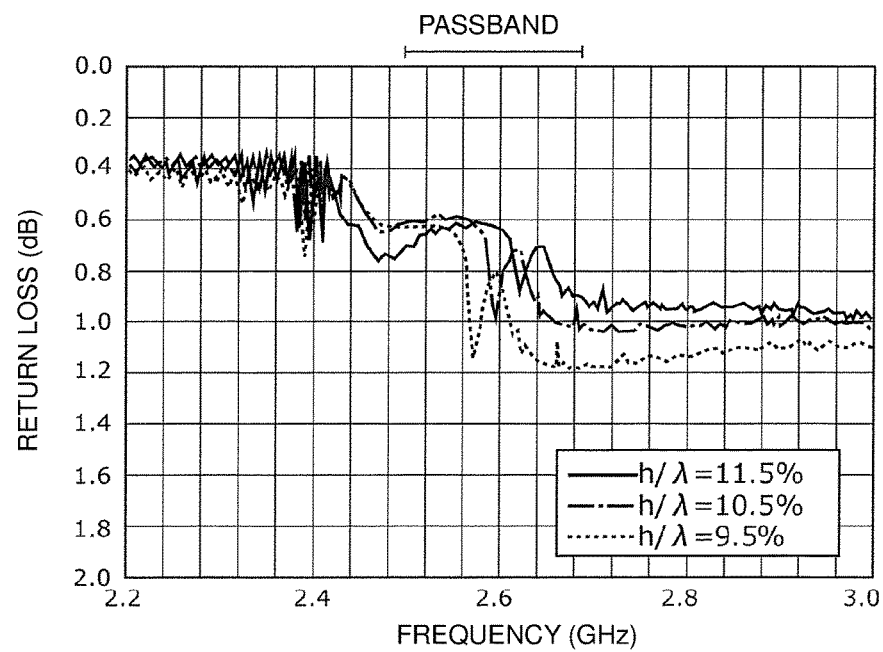
FIG. 8B is a graph illustrating return-loss-frequency characteristics of the parallel resonator according to the second exemplary preferred embodiment of the present invention and the parallel resonator according to the second comparative example in comparison.

FIG. 8A is a graph illustrating impedance-frequency characteristics of the parallel resonator 211 according to the second exemplary preferred embodiment and a parallel resonator according to the second comparative example in comparison. FIG. 8B is a graph illustrating return-loss-frequency characteristics of the parallel resonator 211 according to the second exemplary preferred embodiment and the parallel resonator according to the second comparative example in comparison. In FIGS. 8A and 8B, impedances (=20 log|Z|) and return losses (dB) are compared for the parallel resonator of the SAW filter (having the normalized film thickness h/λ of about 9.5%) according to the second comparative example, the parallel resonator 211 of the SAW filter 20 (having the normalized film thickness h/λ of about 10.5%) according to the second exemplary preferred embodiment A, and the parallel resonator 211 of the SAW filter 20 (having the normalized film thickness h/λ of about 11.5%) according to the second exemplary preferred embodiment B. The term "return loss" used in the second exemplary preferred embodiment refers to a ratio of a reflected power from the parallel resonator 211 to an input power to the parallel resonator 211 expressed in decibels (dB).

FIG. 8B indicates that, as the normalized film thickness h/λ increases, not only the cutoff frequency $f_{BR}$ due to bulk wave radiation becomes higher but also return loss is improved at frequencies higher than the cutoff frequency $f_{BR}$.

The SAW filter 20 according to the second exemplary preferred embodiment has the bandwidth ratio of about 7.46%, which indicates that the passband is made wider than that of the SAW filter 10 (having a bandwidth ratio of about 3.84%) according to the first exemplary preferred embodiment. Accordingly, to shift the cutoff frequency $f_{BR}$ due to bulk wave radiation of the parallel resonator 211 to be in a frequency range higher than the passband, the frequency interval ($f_{BR}$-fap) between the cutoff frequency $f_{BR}$ and the anti-resonant frequency fap of the parallel resonator 211 needs to be approximately 310 MHz. It is difficult to obtain preferable conditions of the normalized film thickness and the duty ratio for achieving this frequency interval.

However, the SAW filter 20 according to the second exemplary preferred embodiment successfully reduces insertion loss in the passband by reducing return loss at frequencies higher than the cutoff frequency $f_{BR}$ due to bulk wave radiation even if the cutoff frequency $f_{BR}$ is in the passband.

Note that the cutoff frequency $f_{BR}$ is about 2.62 GHz, about 2.64 GHz, and about 2.6 GHz in the second exemplary preferred embodiment A, the second exemplary preferred embodiment B, and the second comparative example, respectively.

The cutoff frequency $f_{BR}$ due to bulk wave radiation of a typical existing narrow-band SAW filter (having a bandwidth ratio of about 2.3% or less) is in an attenuation band that is sufficiently higher than the passband of the SAW filter. Accordingly, insertion loss of the SAW filter is determined substantially solely by loss in a range from the resonant frequency to the anti-resonant frequency of resonators of the SAW filter, and the preferable ranges for the normalized film thickness h/λ and the duty ratio are about 7.5% to about 8.0% and about 0.55 to about 0.65, respectively (for example, Japanese Unexamined Patent Application Publication No. 2013-102418).

However, as the passband of the SAW filter widens, the cutoff frequency $f_{BR}$ due to bulk wave radiation comes to be located in the passband. As a result, the insertion loss deteriorates in the passband.

To decrease the insertion loss in the passband of the SAW filter from this viewpoint, it is necessary to set the preferable normalized film thickness and the preferable duty ratio by taking particularly the influence of loss caused by bulk wave radiation into consideration as well as reduction of propagation loss in the range from the resonant frequency to the anti-resonant frequency of the resonators.

FIG. 9 is a graph illustrating correlations among the normalized film thickness, the duty ratio, and the return loss. Specifically, the graph of FIG. 9 illustrates a result of finite-element-method-based simulation for analyzing how the return loss changes at frequencies higher than the cutoff frequency $f_{BR}$ due to bulk wave radiation of the parallel resonator 211 when the normalized film thickness and the duty ratio are changed.

As illustrated in FIG. 9, the return loss decreases at frequencies higher than the cutoff frequency $f_{BR}$ as the normalized film thickness h/λ increases when the graph is viewed by assuming that the duty ratio (about 0.30 to about 0.80) is constant. In addition, the return loss decreases at frequencies higher than the cutoff frequency $f_{BR}$ as the duty ratio increases when the graph is viewed by assuming that the normalized film thickness h/λ (about 8.0 to about 14.2) is constant. This indicates that the return loss may be reduced at frequencies higher than the cutoff frequency $f_{BR}$ by increasing the duty ratio and the normalized film thickness h/λ.

The graph of FIG. 9 includes double circles indicating the SAW filters 20 (having the normalized film thicknesses h/λ of about 10.5% and about 11.5%) according to the second exemplary preferred embodiments A and B, respectively, and a double triangle indicating the SAW filter (having the normalized film thickness h/λ of about 9.5%) according to the second comparative example.

As described above, the influence of loss caused by bulk wave radiation is reduced in the passband by increasing the normalized film thickness and the duty ratio; however, an upper-limit value and a lower-limit value are set for each of the normalized film thickness and the duty ratio in the second exemplary preferred embodiment from the same viewpoint as that of the first exemplary preferred embodiment. That is, it is preferable that the normalized film thickness h/λ of the SAW filter 20 according to the second exemplary preferred embodiment is set to be greater than or equal to about 8% and less than or equal to about 14% and that the duty ratio is set to be greater than or equal to about 0.30 and less than or equal to about 0.80.

As described above, when the bandwidth ratio of the SAW filter becomes larger than approximately 2.3%, the insertion loss in the passband is not determined solely by the propagation loss in a range from the resonant frequency to the anti-resonant frequency of resonators and is greatly affected by the loss caused by bulk wave radiation at frequencies higher than the anti-resonant frequency.

The ladder-type SAW filter 20 according to the second exemplary preferred embodiment utilizes a leaky wave that propagates on the piezoelectric substrate 11 preferably made of a 44.5° Y—X LiTaO3 single crystal and includes the series resonators 111, 112, 121, and 122 and the parallel resonators 211 to 213 and 221 to 223 each defined by two opposing IDT electrodes 14a and 14B disposed on the piezoelectric substrate 11. The ladder-type SAW filter 20 has a bandwidth ratio of about 2.5% or greater, and has a return loss of about 1 dB or less at frequencies higher than the cutoff frequency fBR due to bulk wave radiation of the parallel resonator 211.

Since such a configuration successfully reduces loss caused by bulk wave radiation at frequencies higher than the cutoff frequency fBR, the insertion loss is reduced on a high frequency side in the passband.

Note that a 44.5° Y—X LiTaO3 single crystal is preferably used as the piezoelectric substrate 11 according to the second exemplary preferred embodiment; however, the cut angle of the single crystal material is not limited to this particular angle. That is, the cut angle of a piezoelectric substrate of the SAW filter that uses a LiTaO3 substrate as the piezoelectric substrate, utilizes leaky surface acoustic waves, and has a return loss of about 1 dB or less at frequencies higher than the cutoff frequency fBR due to bulk wave radiation of a parallel resonator in the case of a bandwidth ratio of about 2.5% or greater is not limited to 44.5° Y. Even a SAW filter using a LiTaO3 piezoelectric substrate cut at a cut angle other than the above one may exert the similar advantageous effects.

Optimization conditions based on both the preferable ranges for the normalized film thickness and the duty ratio of the SAW filter 10 according to the first exemplary preferred embodiment and the preferable ranges for the normalized film thickness and the duty ratio of the SAW filter 20 according to the second exemplary preferred embodiment will be described in detail.

FIG. 10 is a graph illustrating preferable ranges for the normalized film thickness and the duty ratio of the SAW filter according to a preferred embodiment of the present invention. FIG. 10 illustrates preferable ranges for the normalized film thickness and the duty ratio of the IDT electrodes of the SAW filter that reduces the influence of bulk wave radiation to address a wider passband. The horizontal axis of FIG. 10 denotes the bandwidth ratio of the SAW filter, and the vertical axis of FIG. 10 denotes the normalized film thickness for different duty ratios.

As illustrated in FIG. 10, the preferable value for the normalized film thickness changes depending on the bandwidth ratio of the SAW filter. The preferable ranges for the normalized film thickness and the duty ratio are determined roughly for each of three bandwidth-ratio ranges (ranges 1 to 3).

The range 1 corresponds to the case where the bandwidth ratio of the SAW filter is small (less than about 2.5%). In this case, the frequency interval (fBR-fap) is sufficiently large relative to the passband width Bw, and the influence of propagation loss in the range from the resonant frequency to the anti-resonant frequency of the resonators alone needs to be considered by using an existing method. As illustrated in FIG. 10, the preferable value for the normalized film thickness h/λ is approximately 9% when a 42°-to-46° Y—X TiTaO3 piezoelectric substrate is used, for example.

The range 2 corresponds to the case where the bandwidth ratio of the SAW filter is in a range from about 2.5% to about 4.0%. This case corresponds to the first exemplary preferred embodiment, that is, the case where the influence of propagation loss in the range from the resonant frequency to the anti-resonant frequency of the resonators is considered and also the cutoff frequency fBR due to bulk wave radiation is shifted to be in a frequency band higher than the passband of the SAW filter. In this case, the preferable range for the normalized film thickness changes depending on the bandwidth ratio, and the normalized film thickness and the duty ratio for each bandwidth ratio is in a range of a region A illustrated in FIG. 10. That is, the normalized film thickness is greater than or equal to about 9.0% and is less than or equal to about 13.0%, and the duty ratio is greater than or equal to about 0.3 and less than equal to about 0.8.

Note that the region A may be defined by coordinates A1 to A4, each of which is denoted by (bandwidth ratio, normalized film thickness). That is, the region A is a region defined by a line that connects A1(2.5, 9.0) to A2(3.3, 9.0), a line for the duty ratio of 0.80 that connects A2(3.3, 9.0) to A3(4.0, 10.3), a line that connects A3(4.0, 10.3) to A4(4.0, 13.0), and a line for the duty ratio of 0.30 that connects A4 (4.0, 13.0) to A1(2.5, 9.0).

Further, it is more preferable that the duty ratio is set in a range from about 0.40 to about 0.70 because, at such duty ratio, the resonance Q value, the anti-resonance Q value, and the temperature characteristics of each resonator are successfully maintained at certain levels and frequency variances due to the processing accuracy during the process are successfully reduced. In this case, the region A is a range where the bandwidth ratio is greater than or equal to about 3.2%.

The range 3 corresponds to the case where the bandwidth ratio of the SAW filter is in a range of about 4.0% or greater. This case corresponds to the second exemplary preferred embodiment, and is a range in which the return loss is about 1.0 dB or less at frequencies higher than the cutoff frequency fBR due to bulk wave radiation. In this case, the preferable normalized film thickness and the preferable duty ratio are in a range of a region B illustrated in FIG. 10. That is, the normalized film thickness is greater than or equal to about 10.3% and is less than or equal to about 13.0%, and the bandwidth ratio is greater than or equal to about 4.0% and less than or equal to about 15.6%. In addition, it is preferable that the duty ratio is greater than or equal to about 0.3 and less than equal to about 0.8.

The normalized film thickness is set to be less than or equal to about 13.0% because of the following reason. When the normalized film thickness is made greater than about 13.0%, the propagation loss in the range from the resonant frequency to the anti-resonant frequency of the resonators, which is the fundamental characteristics of the SAW filter, deteriorates, and consequently the insertion loss deteriorates in the passband.

The normalized film thickness and the duty ratio that realize the feature of the second exemplary preferred embodiment in which the return loss is about 1.0 dB or lower at frequencies higher than the cutoff frequency fBR due to bulk wave radiation are in the region B illustrated in FIG. 10; however, the settings are not limited to this one. For example, the insertion loss is reduced in the passband by applying the condition of the return loss of about 1.0 dB or less at frequencies higher than the cutoff frequency fBR to the range 2 where the bandwidth ratio is in the range from about 2.5% to about 4.0%. That is, the preferable normalized film thickness, the preferable duty ratio, and the bandwidth ratio of the SAW filter 20 according to the second exemplary preferred embodiment may be greater than or equal to about 10.3% and less than or equal to about 13.0%, be greater than or equal to about 0.30 and less than or equal to about 0.80, and be greater than or equal to about 2.5% and less than or equal to about 15.6%, respectively.

Since such a configuration reduces bulk wave radiation at frequencies higher than the cutoff frequency fBR, the insertion loss may be further reduced on a high frequency side in the passband even if the cutoff frequency fBR is not in the passband.

As described above, when the bandwidth ratio is about 4% or less, a SAW filter according to a preferred embodiment of the present invention successfully shifts the cutoff frequency fBR due to bulk wave radiation at frequencies higher than the anti-resonant frequency fap of the parallel resonator, to be in a frequency range higher than the passband of the SAW filter, by including the normalized film thickness and the duty ratio in the region A. Accordingly, the SAW filter successfully reduces the insertion loss on a high frequency side in the passband.

In addition, when the bandwidth ratio is greater than about 4%, the return loss is about 1 dB or less at frequencies higher than the cutoff frequency fBR of the parallel resonator and bulk wave radiation is reduced. Accordingly, the SAW filter successfully reduces the insertion loss on a high frequency side in the passband even if the cutoff frequency fBR is in the passband.

Third Exemplary Preferred Embodiment

In a third exemplary preferred embodiment of the present invention, a reduction in loss in a longitudinally-coupled-type SAW filter will be described.

A basic structure of the SAW filter according to the third exemplary preferred embodiment of the present invention will be described. In the third exemplary preferred embodiment, a bandpass SAW filter used for Band 28 (passband: 758-803 MHz, bandwidth ratio: 5.76%) will be described by way of example.

Figure 11:
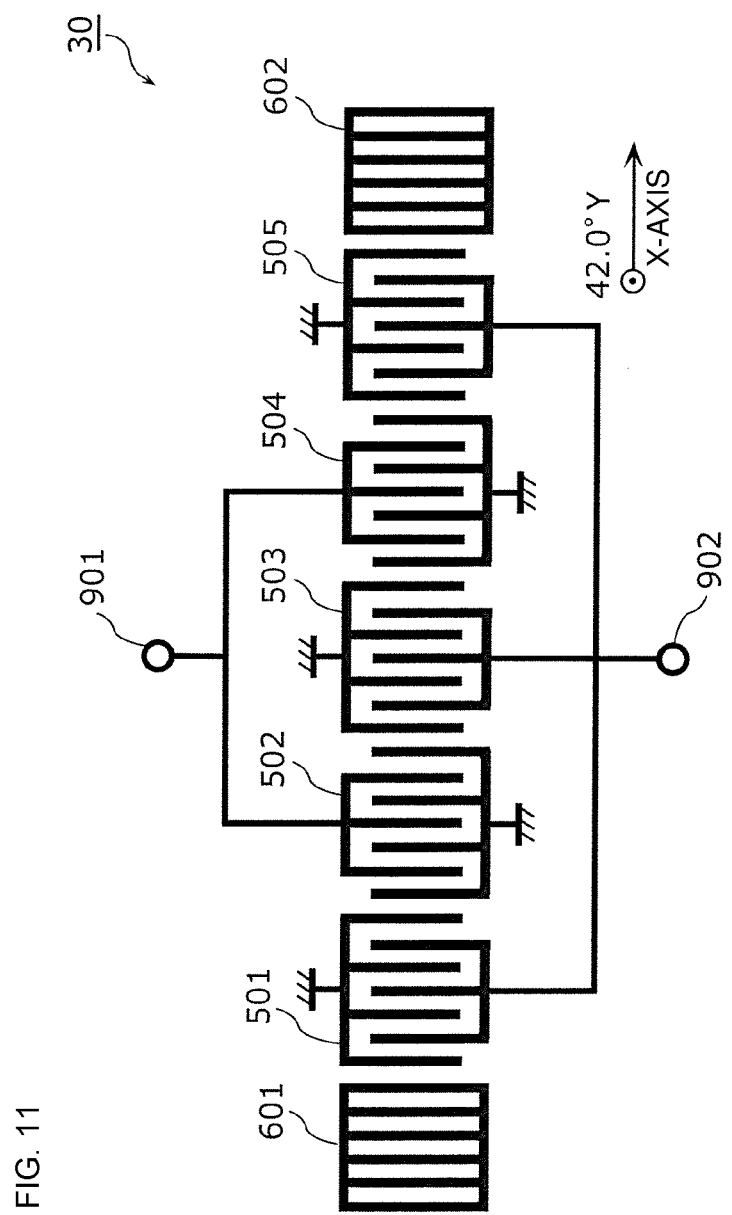
FIG. 11 is a schematic plan view of a SAW filter according to a third exemplary preferred embodiment of the present invention.

FIG. 11 is a schematic plan view of a SAW filter 30 according to the third exemplary preferred embodiment. As illustrated in FIG. 11, the SAW filter 30 includes IDTs 501 to 505, reflectors 601 and 602, an input terminal 901, and an output terminal 902.

Each of the IDTs 501 to 505 includes a pair of opposing IDT electrodes. The IDTs 502 and 504 are disposed with the IDT 503 interposed therebetween in the X-axis direction. The IDTs 501 and 505 are disposed with the IDTs 502, 503, and 504 interposed therebetween in the X-axis direction. The reflectors 601 and 602 are disposed with the IDTs 501 to 505 interposed therebetween in the X-axis direction. The IDTs 502 and 504 are connected parallel to each other between the input terminal 901 and a reference terminal (ground). The IDTs 501, 503, and 505 are connected parallel to one another between the output terminal 902 and a reference terminal.

The basic structure of the IDTs 501 to 505 and the piezoelectric substrate are substantially the same as that illustrated in FIG. 2. Specifically, the pair of opposing IDT electrodes 14a and 14B is disposed on the piezoelectric substrate 11. The piezoelectric substrate 11 is preferably made of a 42.0° Y—X LiTaO$_3$ piezoelectric single crystal or piezoelectric ceramic. In addition, the layered structure of the IDT electrodes is substantially the same as that of the first and second exemplary preferred embodiments.

In addition, the SAW filter 30 according to the third exemplary preferred embodiment has a normalized film thickness h/λ of about 10.9% and a duty ratio of about 0.70.

Table 3 shows details of design parameters (capacitance and wavelength) of the IDTs 501 to 505 and the reflectors 601 and 602 of the SAW filter 30 according to the third exemplary preferred embodiment.

TABLE 3

|  | IDT 501 505 | IDT 502 504 | IDT 503 | Reflector 601 602 |
|---|---|---|---|---|
| Capacitance (pF) | 1.8 | 1.9 | 3.7 | 2.8 |
| Wavelength (μm) | 4.962 | 4.962 | 5.012 | 5.116 |

Figure 12:
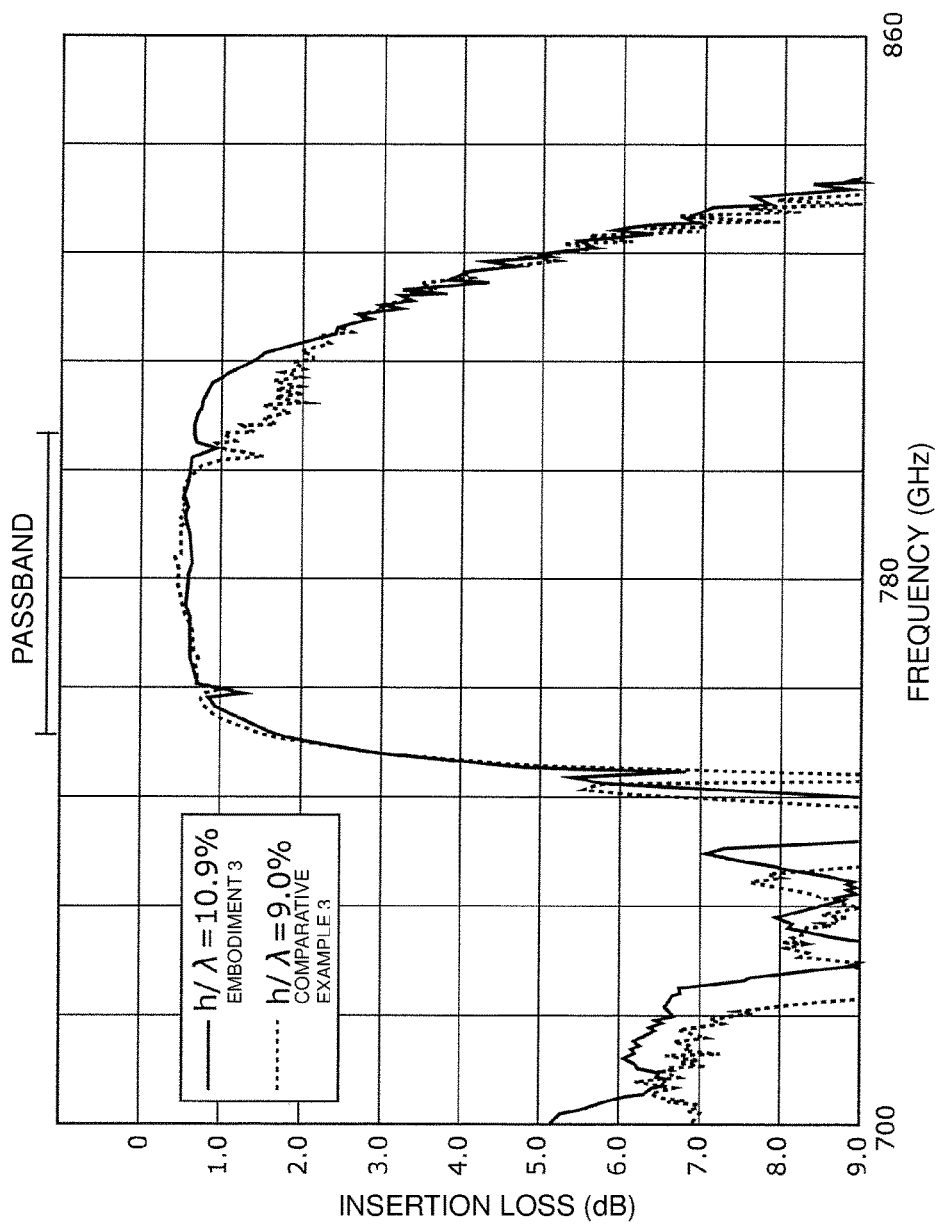
FIG. 12 is a graph illustrating of bandpass characteristics of the SAW filter according to the third exemplary preferred embodiment of the present invention and a SAW filter according to a third comparative example in comparison.

FIG. 12 is a graph illustrating bandpass characteristics of the SAW filter 30 according to the third exemplary preferred embodiment and a SAW filter according to a third comparative example in comparison. In the graph of FIG. 12, insertion-loss-frequency characteristics of the SAW filter (having the normalized film thickness h/λ of about 10.9%) according to the third exemplary preferred embodiment and the SAW filter (having a normalized film thickness h/λ of about 9.0%) according to the third comparative example are compared with each other. The bandpass characteristics illustrated in FIG. 12 indicate that the SAW filter 30 (having the normalized film thickness h/λ of about 10.9%) according to the third exemplary preferred embodiment successfully makes loss lower on a high frequency side in the passband than the SAW filter (having the normalized film thickness h/λ of about 9.0%) according to the third comparative example.

When the bandwidth ratio of the longitudinally-coupled-type SAW filter becomes larger than approximately 2.3%, the insertion loss in the passband is not determined solely by the propagation loss in a range from the resonant frequency to the anti-resonant frequency of resonators and is greatly affected by the loss caused by bulk wave radiation at frequencies higher than the anti-resonant frequency.

The longitudinally-coupled-type SAW filter 30 according to the third exemplary preferred embodiment utilizes a leaky wave that propagates on the piezoelectric substrate 11 made of a 42.0° Y—X LiTaO$_3$ single crystal and includes the IDTs 501 to 505 disposed on the piezoelectric substrate 11. A bandwidth ratio of the longitudinally-coupled-type SAW filter 30 is about 2.5% or greater, and the cutoff frequency $f_{BR}$ due to bulk wave radiation of the resonators defined by the IDTs 501 to 505 and the piezoelectric substrate is in a frequency range higher than the passband.

Since such a configuration successfully shifts the cutoff frequency $f_{BR}$ due to bulk wave radiation to be in a frequency range higher than the passband of the SAW filter, the insertion loss is reduced substantially at the higher end of the passband.

In addition, for the SAW filter 30 according to the third exemplary preferred embodiment, the return loss may be about 1 dB or lower at frequencies higher than the cutoff frequency $f_{BR}$ due to bulk wave radiation of the resonator.

Since such a configuration reduces loss caused by bulk wave radiation at frequencies higher than the cutoff frequency $f_{BR}$, insertion loss is reduced on a high frequency side in the passband even if the cutoff frequency $f_{BR}$ is in the passband.

Note that a 42.0° Y—X LiTaO$_3$ single crystal is preferably used as the piezoelectric substrate 11 according to the third exemplary preferred embodiment; however, the cut angle of the single crystal material is not limited to this particular angle. That is, the cut angle of a piezoelectric substrate of the SAW filter that uses a LiTaO$_3$ substrate as the piezoelectric substrate, utilizes leaky surface acoustic waves, and has the cutoff frequency $f_{BR}$ due to bulk wave radiation of the resonator that is in a frequency range higher than the passband in the case of the bandwidth ratio of about 2.5% or greater is not limited to 42.0° Y. In addition, the cut angle of a piezoelectric substrate of the SAW filter that uses a LiTaO$_3$ substrate as the piezoelectric substrate, utilizes leaky surface acoustic waves, and has the bulk-wave-radiation-caused return loss of 1 dB or less at frequencies higher than the cutoff frequency due to bulk wave radiation of the resonator in the case of the bandwidth ratio of about 2.5% or greater is not limited to 42.0° Y. Even a SAW filter using a LiTaO$_3$ piezoelectric substrate cut at a cut angle other than the above one may exert the similar advantageous effects.

While surface acoustic wave filters according to preferred embodiments of the present invention have been described using the first to third exemplary preferred embodiments, the present invention is not limited to the individual exemplary preferred embodiments. For example, the following modifications of the above exemplary preferred embodiments can also be included in the present invention.

For example, in the first exemplary preferred embodiment, the cutoff frequency $f_{BR}$ due to bulk wave radiation preferably is extracted for the parallel resonator 201 that is the closest to the input terminal 701 among the plurality of parallel resonators; however, the parallel resonator used is not limited to this. Specifically, the normalized film thickness and the duty ratio of the parallel resonator may be set by extracting the cutoff frequency $f_{BR}$ for at least one of the parallel resonators 202 to 204.

In addition, for example, in the second exemplary preferred embodiment, the return loss at frequencies higher than the cutoff frequency $f_{BR}$ due to bulk wave radiation preferably is extracted for the parallel resonator 211 that is the closest to the input terminal 801 among the plurality of parallel resonators; however, the parallel resonator used is not limited to this. Specifically, the normalized film thickness and the duty ratio of the parallel resonator may be set by extracting the return loss at frequencies higher than the cutoff frequency $f_{BR}$ for at least one of the parallel resonators 212, 213, 221, 222, and 223.

Preferred embodiments of the present invention are widely applicable, as a low-loss SAW filter with a large bandwidth ratio, to communication devices, such as mobile phones.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A surface acoustic wave filter comprising:
a LiTaO$_3$ piezoelectric substrate; and
interdigital transducer electrodes disposed on the LiTaO$_3$ piezoelectric substrate; wherein
the surface acoustic wave filter is a ladder-type surface acoustic wave filter including series resonators and parallel resonators defined by the interdigital transducer electrodes and utilizes a leaky wave that propagates on the LiTaO$_3$ piezoelectric substrate; wherein
a bandwidth ratio that indicates a bandwidth of a passband of the surface acoustic wave filter is about 2.5% or greater;
a cutoff frequency at which bulk wave radiation of one of the parallel resonators increases is in a frequency range higher than the passband;
a normalized film thickness that is a ratio of a film thickness of the interdigital transducer electrodes of the parallel resonator to a repetitive pitch of a plurality of electrode fingers of the interdigital transducer electrodes of the parallel resonator is greater than or equal to about 9.0% and less than or equal to about 13.0%; and
a duty ratio that is a ratio of a line width of the plurality of electrode fingers to a sum of the line width and a space width between the plurality of electrode fingers is greater than or equal to about 0.3 and less than or equal to about 0.8.

2. The surface acoustic wave filter according to claim 1, wherein the bandwidth ratio is about 3.0% or greater.

3. The surface acoustic wave filter according to claim 1, wherein the normalized film thickness and the duty ratio are in a range of a region A illustrated in FIG. 10.

* * * * *